Oct. 10, 1967 W. G. REIMANN 3,345,741

WELDABLE PRINTED CIRCUIT BOARD TECHNIQUES

Filed March 14, 1963

INVENTOR:
William G. Reimann

By Alan C. Rose
Attorney

United States Patent Office 3,345,741

Patented Oct. 10, 1967

3,345,741
WELDABLE PRINTED CIRCUIT BOARD TECHNIQUES

William G. Reimann, Sherman Oaks, Calif., assignor to Litton Systems, Inc., Beverly Hills, Calif.

Filed Mar. 14, 1963, Ser. No. 265,178
10 Claims. (Cl. 29—626)

This invention relates to improvements in weldable printed circuit boards and methods for making them.

As disclosed in United States patent application Ser. No. 164,359 of William G. Reimann and Richard R. Douglas, entitled, "Welded Circuit Board Technique," filed Jan. 4, 1962, and in patent application Ser. No. 134,-248, of John W. and William Toomey, entitled, "Electrical Connection," filed Aug. 28, 1961, it has previously been proposed to form printed circuit boards with integral metal tubes which are employed for welding the circuit board pattern to the associated components. To facilitate the welding operation, the tubes and the circuit board pattern may be formed of nickel, nickel alloys, or other comparable metal which is of higher resistance than the normal electrical component leads and which has good welding properties. Through the use of circuit boards provided with welding tubes, many of the advantages of welded circuit connections, including strength and resistance to vibration and other adverse conditions, may be achieved, in addition to the usual significant advantages of printed circuit boards.

Up to the present time, the methods for making weldable printed circuit boards have been somewhat complex and expensive. Accordingly, a principal object of the invention is to simplify and reduce the cost of weldable circuit boards.

In accordance with the present invention, an improved method of fabricating weldable circuits permits the manufacture of tube-type weldable printed circuit boards which are much less expensive and which have increased mechanical strength as compared with the circuit boards of the prior art.

In accordance with an illustrative method for the implementation of the present invention, a conventional printed circuit board base, such as fiberglass impregnated with plastic, is secured to a layer of strippable material, such as rubber, wax or other substances, discussed in application Ser. No. 164,359.

At points where the components are to be secured to the printed circuit board, holes are formed through both the printed circuit board base and the strippable layer. In addition, the printed circuit board pattern is formed on the exposed surfaces of the printed circuit board. An initial plating of copper is made on the desired areas of the circuit board and completely through the holes in the double-thickness sheet. This plating of copper may be relatively thin, in the order of 0.0005 to 0.002 inch, for example, and the plating may be restricted to the inner surface of the holes and the desired areas for a conductive pattern on the printed circuit board. Areas on the outside surface of the strippable material may also be plated to improve the current distribution in the electroplating bath and the quality of the finished plated hole, but these conductive areas should preferably be spaced from the holes. The strippable layer is then removed, leaving the copper tubes extending through the circuit board base member and beyond its surface by a distance equal to the thickness of the layer which has been removed. A layer of material such as nickel is then plated onto the copper coated areas of the assembly, producing a welding tube which has a thin inner copper core and an outer layer of nickel. The nickel coating would typically be about 0.001 to 0.003 inch thick, making the tubing wall about 0.0025 to 0.008 inch in thickness. Either the tubes alone may be plated by the immersion of the extending copper tubes, or, preferably, the entire printed circuit board unit is immersed in the plating solution and a layer of nickel is plated onto all exposed conductive areas of the printed circuit board assembly.

The other techniques for making weldable printed circuits have generally involved a transfer step in which the printed circuit board conducting elements are transferred onto the insulating backing member, or required an alignment of holes separately formed on the printed circuit board and a removable electroplating form. In accordance with one aspect of the present invention, these disadvantages have been overcome by the use of the simple pair of sheets, one of which is the circuit board base member and the other being removable from the circuit board at an intermediate point in the process.

The present invention has the additional advantage of providing tubes which extend through the board in the manner of "plated-through" holes which strengthen the mechanical bond of the conductive printed circuit pattern to the circuit board base.

In accordance with a feature of the present invention, therefore, a weldable printed circuit board may be formed by securing an insulating circuit board base sheet to a body of removable material, forming holes extending through the base sheet and into the removable material, plating conductive material into the holes in the base sheet and the removable material, and separating the removable material from the base sheet to provide conductive tubes extending from one side of the sheet.

In accordance with further features of the invention, the resultant circuit board may have an additional coating of an easily weldable material, such as nickel, applied to the conducting tubes, and electrical leads may be inserted through and welded to the conductive tubes.

In accordance with a further feature of the invention, a weldable printed circuit board may be provided with a circuit pattern on one side and a series of "plated-through" holes extending in the form of integral tubes beyond the other side of the circuit board, and these tubes may be provided with additional layers of conductive material which extend beyond the edges of the holes on the other side of the circuit board. The additional coating is preferably of nickel or some other similar material having good welding properties. Electrical components are subsequently secured to the printed circuit board by the welding of the component leads to the protruding tubes. The mechanical strength of the final assembly is increased both by the use of welding techniques and by the extension of the tubes through the board and their overlap on both sides of the circuit board.

As applied to multiple layer printed circuit boards, the process of the present invention has the advantage of providing selective interconnections to and between the circuit layers concurrently with the formation of the weldable tubes.

The novel features which are believed to be characteristic of the invention both as to its organization and method of construction, together with further objects, features and advantages thereof, will be better understood from the following description taken in connection with the accompanying drawings which illustrate the techniques of the invention. It is to be expressly understood, however, that the drawings are for the purposes of illustration and description only and do not constitute limitations of the invention.

Figure 1:
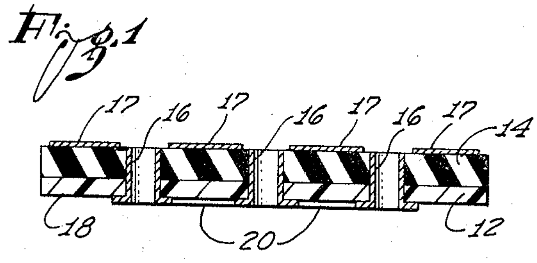
FIG. 1 is a cross-sectional view of an intermediate step in the formation of a weldable printed circuit board.

With reference to the drawings, FIG. 1 shows a printed circuit board base member 12 secured to a strippable layer 14. The base sheet 12 may be made of fiberglass impregnated with plastic, or phenolic insulation material, or any of the other forms of insulating sheet material used in the manufacture of printed circuit boards. The layer 14 may be made of rubber or other resilient material, of a plastic which will dissolve in a solvent, or may be made of wax or any other substance which may be removed without damage to the circuit board 12 or the electroplated tubes 16, which extend through the holes in the two sheets.

In accomplishing the method of the present invention, the sheets 12 and 14 are normally secured together and holes representing the desired location of component leads are formed to extend through the two sheets. In accordance with usual circuit board practice, these holes may either be made in a regular pattern or may be irregularly located to accommodate a particular group of components. The next step in the process is to provide a conductive layer extending through each of the holes. This is accomplished by conventional printed circuit board techniques for "plated-through" holes. In some cases the inner surfaces of the holes are initially painted with conductive paint, or dipped in a solution which provides a thin copper layer, and other known techniques may be employed. A suitable conductive pattern may be formed on the lower surface 18 of the plated circuit base sheet 12. This printed circuit pattern may be formed by either the positive or negative processes, but will preferably leave a conductive pattern on the base member 12 in the areas where connections to the tubes 16 are desired. The base member 12 may be initially provided with a coating of copper foil which is etched away in the desired areas. Alternatively, a simple insulating board may be employed, and the conductive pattern may be applied by painting, or otherwise applying, conductive material to selected portions of surface 18 of base 12.

In the course of this initial preparation of the board, a conductive coating applied, preferably by electroplating copper to the inner surfaces of the holes to build up a conductive layer which is from one-half to several thousandths of an inch thick. If desired, the printed circuit pattern 20 on the lower surfaces 18 of the board 12 may also be built up during the electroplating operation. Areas of conductive material 17 may be electroplated onto the upper surface of the strippable layer 14. These areas, known as "robbers" in the electroplating art, improve the distribution of current and avoid excessive build-up of copper at the ends of the tubes. To avoid attachment to the tubes 16, the conductive areas 17 are spaced from the ends of the tubes. This may be accomplished by the use of a ring of "resist" around the holes or by other suitable masking arrangements when the initial coating of copper is applied to the unit.

Figure 2:
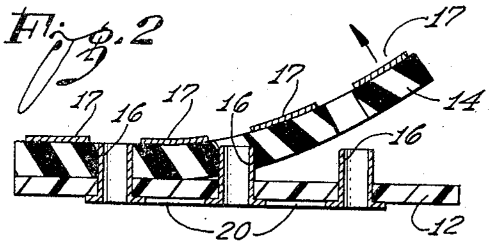
FIG. 2 represents another step in this process.

The next step in the process is the removal of the strippable layer 14 as clearly shown in FIG. 2. In the case of rubber material, the layer 14 may be freely pulled away from the board 12. When a low melting point material, such as wax or a low melting point metal, is employed, the printed circuit board may be heated by immersion in a hot liquid which melts the material. A plastic material, which can be dissolved in a solvent which does not react with the board 12, may also be employed. In each case an appropriate technique is employed for removing the particular strippable material which is used.

Figure 3:
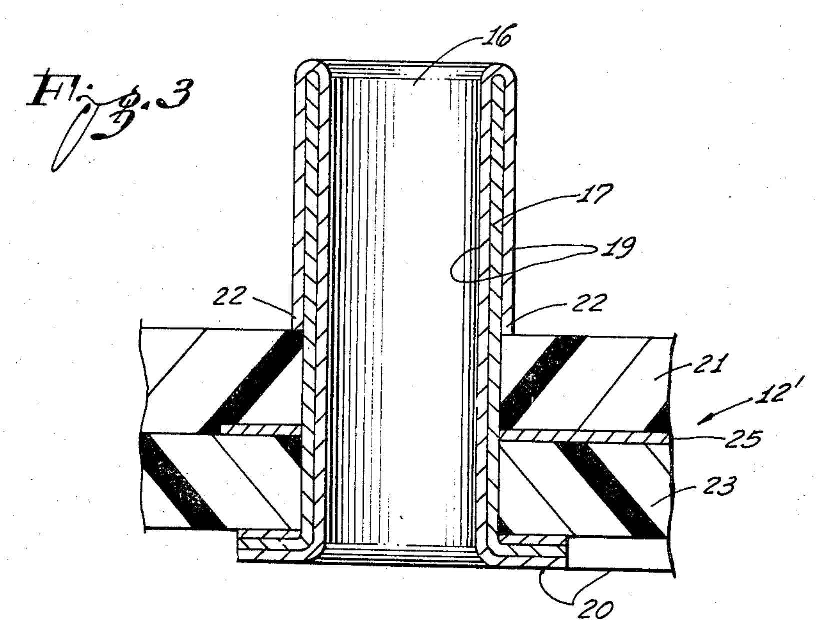
FIG. 3 is a cross-sectional view of a single weldable tube ready for the attachment of a component lead.

Following the removal of the strippable layer 14, an additional coating of nickel may be electroplated over the thin copper core. A cross-sectional view through a typical weldable tube is presented in FIG. 3. As the invention is applicable to both single and multiple layer boards, FIG. 3 shows a multiple layer board 12'. It may be noted that the additional layer of material 19 extends at 22 beyond the outer perimeter of the hole through the circuit board 12'. This is advantageous in assuring mechanical strength of the unit. Thus, when the circuit pattern 20 is formed by plating up from the initial pattern, the bond between the circuit pattern and the circuit board is strengthened by a regular pattern of firm mechanical retention points, provided by the tubes 16 which extend through the holes and overlap their perimeter in the zones 20.

FIG. 3 shows a multilayer printed circuit board 12' including an upper insulating layer 21, a lower insulating layer 23, and a conductive pattern 25 sandwiched between layers 21 and 23, in addition to the circuit pattern 20 on the lower surface of board 12'. The tubes 16 serves to interconnect patterns 20 and 25 at preselected points. The board 12' may also be built up of more than two layers as indicated generally in the copending patent application Ser. No. 104,683 of Norman J. Schuster et al., filed April 21, 1961, entitled "Multilayer Laminated Wiring."

The tubes 16 are preferably formed of an inner copper core 17 and on outer coating of nickel 19. In electroplating work, it is relatively difficult to plate nickel on the inside of a hole, such as those shown in FIG. 1. This is the result of the lack of "throwing power" of nickel as compared to copper in electroplating work. After a good structural copper core 17 is provided, however, it is much less difficult to provide an outer plating of nickel 19 adequate for welding purposes, which extends through the tube and on the outer surfaces of the copper core 17, as shown in FIG. 3. With regard to the outer coating of nickel in FIG. 3, this may be extended to cover the lower conductive pattern 20, if desired. Alternatively, only the ends of the copper tubes 16 may be immersed in the nickel plating solution and the nickel coating may be restricted to this area which will be used in the welding operation.

It is particularly to be noted, however, that while copper and nickel are the preferred materials, either a single material, preferably nickel, could be employed, or two different metals or alloys could be used. In general, however, it is good to have a conductive material of relatively high resistance and having good welding properties as the outer coating of the tube. Nickel has a resistivity of 6.84 microhms per centimeter, as compared with 1.673 microhms per centimeter for copper. Various other metals and alloys which have good welding properties are discussed in Robert Lindstrand patent application Ser. No. 228,535, filed Oct. 5, 1962, assigned to the assignee of this application. For the outer layer, nickel or nickel alloys are to be preferred for their good welding properties.

Figure 4:
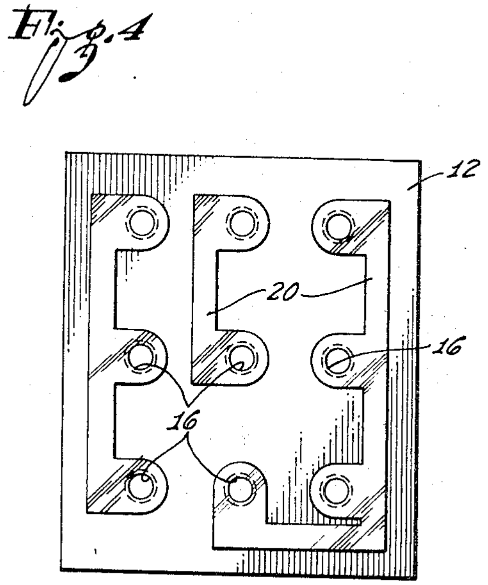
FIG. 4 illustrates a typical weldable printed circuit made in accordance with the present invention.

FIG. 4 is a simplified showing of a weldable circuit board indicating the lower surface 18 of the board of FIG. 1. The holes 16 are formed in a regular array on the board shown in FIG. 4, and the outer edges of the tubes are shown in dashed lines, as the tubes extend outwardly away from the observer in the view of FIG. 4. Normally, circuit boards tend to be more complex than the simple board of FIG. 4; however, it is presented to illustrate the principles of the present invention in a simplified form.

Figure 5:
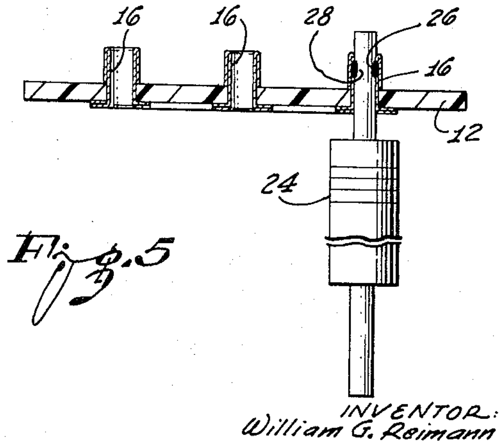
FIG. 5 shows a component welded to the printed circuit board of FIG. 4.

FIG. 5 shows an electrical component 24 secured to a tube 16 attached to the printed circuit board 12. In practice, welding electrodes are clamped across the nickel tube 16 and produce two welds 26 and 28 on either side of the tube where the lead is welded to the tube. As seen in FIG. 5, the tubes preferably extend beyond the surface of the circuit board a distance at least equal to the radius of the tubes to facilitate the welding operation. As discussed in detail in the other patent applications cited above, the use of a high resistance material of good welding properties for the tubes means that the lowest resistance path will be through the component lead rather than around the periphery of the tube. As used herein, the term "high resistance" will refer to materials having at least twice the resistance of copper. This technique provides two good welds between the tube and the conductor lead, one on each side of the tube. In addition, the fact that the welding electrodes only contact a single material avoids the necessity for changing welding electrode materials and also greatly reduces the sensitivity of the welding conditions. When manufacturers are faced with the different materials which are present in the leads of commercially available electrical resistors, capacitors, transistors, and the like, this is a substantial advantage.

It is to be understood that the above described methods and arrangements are illustrative of the application of the principles of the invention. Numerous other arrangements may be devised by those skilled in the art without departing from the spirit and scope of the invention. Thus, by way of example and not of limitation, the strippable material need not be a thin sheet but may be a relatively thick bed of material; other known printed circuit board techniques may be employed in the formation of the pattern of conductors on the surface of the printed circuit boards; other processes, such as electroless metal transfer, metal spraying, or the like, may be employed to build up the layers of conductive material from the single or multilayer insulating base sheets; the particular dimensions of the conductive layers in the tubes will depend on the size of the components and the mechanical stresses to be encountered, and will obviously vary from those given hereinabove in accordance with difference circuit board requirements; and the first plating step could employ a single thick coating of nickel, so that no further coating steps would be necessary. Accordingly, from the foregoing remarks, it is understood that the present invention is to be limited only by the spirit and scope of the appended claims.

What is claimed is:

1. A method for making welded printed circuit board assemblies comprising the steps of:
mounting one side of an insulating base sheet in contact with a sheet of removable material;
forming holes extending through both sheets;
plating a first conductive material through the holes to form tubes extending from said insulating base sheet by a distance at least equal to the radius of the tubes and onto selected areas of the other side of the insulating sheet to form part of a printed circuit pattern including continuous conductive paths from said selected areas to selected holes;
separating and removing the removable material from the base sheet and the extending tubes to leave thin conductive tubes extending outwardly from the insulating sheet;
plating additional conductive material having a substantially higher resistance than said first conductive material onto the tubes protruding from the insulating base sheet following separation from the removable material;
inserting at least one conductive lead into one of said tubes; and
welding said lead to said tube.

2. A method for making a weldable printed circuit board comprising the steps of:
securing one side of an insulating base sheet to a body of removable material;
forming holes extending through the base sheet and into the removable material;
plating conductive material through the holes in the base sheet and onto the walls of the holes in the removable material to form tubes protruding from said base sheet by a distance at least equal to the radius of the tubes, and plating selected areas of the other side of said base sheet adjacent said holes to form part of a printed circuit pattern; and
separating and removing the removable material from the base sheet and from said extending tubes to produce tubelets which protrude freely from the base sheet.

3. A method for making a weldable printed circuit board of comprising the steps of:
securing an insulating base sheet to a body of removable material;
forming holes extending through the base sheet and into the removable material;
plating conductive material through the holes in the base sheet and into the holes in the removable material to produce conductive tubes protruding beyond the base sheet by a distance at least equal to the radius of the tubes into the removable material;
separating and removing the removable material from the base sheet and the protruding tubes; and
plating additional conductive material onto the tubes protruding from the insulating base sheet following separation from the removable base sheet.

4. A method for making a weldable printed circuit board comprising the steps of:
securing an insulating base sheet to a body of removable material;
forming holes extending through the base sheet and into the removable material;
applying a layer of conductive material onto the walls of the holes in the base sheet and onto the walls of the holes in the removable material to form generally cylindrical tubes protruding beyond the surface of the base sheet by a distance at least equal to the radius of the tubes; and
separating and removing the removable material from the base sheet and from the protruding tubes.

5. A method for making a weldable printed circuit board assembly comprising the steps of:
securing one side of an insulating base sheet to a body ductive material on its other side;
of removable material, said base sheet having con-
forming holes extending through the base sheet and into the removable material;
plating conductive material through the holes in the base sheet and into the holes in the removable material to form hollow conductive tubes protruding beyond the surface of one side of said base sheet by a distance at least equal to the radius of the tubes and into engagement with the conductive material on the other side of said base sheet;
separating and removing the removable material from the base sheet said protruding tubes;
plating additional high resistance conductive material onto the tubes protruding from the insulating base sheet following separation from the removable material;
inserting a conductive lead into one of said tubes; and
welding said lead to said tube.

6. A method for making a weldable printed circuit board assembly comprising the steps of:
mounting an insulating base sheet in contact with a body of removable material;
forming holes extending through the base sheet and into the removable material;
plating conductive material through the holes in the base sheet and into the holes in the removable material to form tubes extending beyond the surface of said base sheet by a distance at least equal to the radius of the tubes;
separating and removing the removable material from the base sheet and from the extending tubes;
plating additional conductive material onto the tubes extending from the insulating base sheet following separation from the removable material;
inserting a conductive lead into one of said tubes; and
welding said lead to said tube.

7. A method for making a welded printed circuit board comprising the steps of:

mounting one side of an insulating base sheet in contact with a sheet of removable material;

forming holes extending through both sheets;

plating conductive material onto the inner walls of the holes to form conductive tubes extending beyond the surface of said sheet by a distance at least equal to the radius of the tubes, onto selected areas of the exposed side of the insulating sheet to form a continuous conductive path from selected areas to the tubes formed within selected holes, and onto areas of the exposed side of the removable sheet which are spaced from the holes;

separating the removable material from the base sheet and from the extending conductive tubes; and plating additional high resistance conductive material onto the tubes extending from the insulating base sheet following separation from the removable material.

8. A method as defined in claim 7, wherein the insulating base sheet includes an embedded printed circuit exposed to at least one of said holes, and the plating operation forms tubes interconnecting said circuit with selected conductively plated areas on the exposed surface of said insulating base sheet.

9. A method for making a welded printed circuit board comprising the steps of:

mounting a sheet of removable material in contact with a circuit board having spaced unconnected parallel circuit patterns;

forming holes extending through both the sheet and the board so as to pass through and expose selected circuit patterns;

applying conductive material to the inner surface of the holes to form tubes extending beyond said circuit board by a distance at least equal to the radius of the tubes into said base sheet and forming a continuous conductive path from said tubes to selected circuit patterns and between selected circuit patterns; and separating and removing the removable material from the circuit board and the extending tubes.

10. A method for making a welded printed circuit board comprising the steps of:

mounting a sheet of removable material in contact with a circuit board having spaced unconnected parallel circuit patterns;

forming holes extending through both the sheet and the board so as to pass through and expose selected circuit patterns;

applying a first conductive material to the inner surface of the holes to form tubes extending beyond said circuit board by a distance at least equal to the radius of the tubes into said sheet of removable material and forming a continuous conductive path from said tubes to selected circuit patterns and between selected circuit patterns;

separating and removing the removable material from the base sheet and the extending tubes; and plating additional conductive material having a substantially higher resistance than said first material onto the tubes extending from the circuit board following separation from the removable material.

References Cited

UNITED STATES PATENTS

| | | | |
|---|---|---|---|
| 2,100,333 | 11/1937 | Hess | 339—278 X |
| 2,912,748 | 11/1959 | Gray | 29—155.5 |
| 2,986,804 | 6/1961 | Greenman | 29—155.5 |
| 3,040,119 | 6/1962 | Granzow | 174—68.5 |
| 3,042,741 | 7/1962 | Cumpston | 29—155.5 |
| 3,163,588 | 12/1964 | Shortt et al. | 29—155.5 X |
| 3,192,135 | 6/1965 | Robbins | 204—15 X |
| 3,209,066 | 9/1965 | Toomey | 29—155.5 |

JOHN F. CAMPBELL, *Primary Examiner.*

JOHN P. WILDMAN, *Examiner.*

R. W. CHURCH, D. L. CLAY, *Assistant Examiners.*